United States Patent [19]

Van Lammeren et al.

[11] Patent Number: 5,606,271
[45] Date of Patent: Feb. 25, 1997

[54] EXTREME LEVEL CIRCUIT

[75] Inventors: Johannes P. M. Van Lammeren; Wietze B. Leistra, both of Nijmegen, Netherlands

[73] Assignee: U.S. Philips Corporation, New York, N.Y.

[21] Appl. No.: 534,774

[22] Filed: Sep. 27, 1995

[30]  Foreign Application Priority Data

Sep. 30, 1994 [EP] European Pat. Off. ............ 94202822.6

[51] Int. Cl.⁶ .................................................. G01R 19/00
[52] U.S. Cl. ............................................. 327/62; 327/58
[58] Field of Search ....................... 327/58, 62, 403–405, 327/407–413, 63, 71

[56]  References Cited

U.S. PATENT DOCUMENTS 3,617,916  11/1971  Smith ...................................... 327/405
4,593,249   6/1986  Arita et al. .............................. 327/62
5,159,211  10/1992  Fujii ........................................ 307/494
5,304,864   4/1994  Hong et al. ............................. 307/351
5,414,310   5/1995  Fattaruso ................................ 327/62
5,467,030  11/1995  Shou et al. .............................. 327/58

FOREIGN PATENT DOCUMENTS 0430707  6/1991  European Pat. Off. ........ G01R 19/30

Primary Examiner—Toan Tran
Attorney, Agent, or Firm—Edward W. Goodman

[57]  ABSTRACT

An extreme level circuit for determining an extreme level of a plurality of input levels includes a plurality of independent parallel branches (T4+M2+M5, T5+M3+M6) with inter-coupled output terminals (MAX) from which the extreme level can be taken. Each branch has an input terminal (INA, INB) for receiving a respective one of the input levels, and includes a separate distortion compensation circuit (M2+M5, M3+M6) which is independent of the distortion compensation circuits of the other parallel branches.

6 Claims, 1 Drawing Sheet

EXTREME LEVEL CIRCUIT

BACKGROUND OF THE INVENTION

1. Field of the Invention

The invention relates to an extreme level circuit, i.e., a circuit for detecting an extreme level (maximum or minimum value) of a plurality of input signals.

2. Description of the Related Art

EP-A-0,430,707 corresponding to U.S. Pat. No. 5,159,211 describes such an extreme level circuit for detecting an extreme level of two input signals. Starting from a well-known circuit comprising a pair of differential transistors with interconnected emitters from which the output extreme level can be taken, an improvement is presented to prevent distortions from occurring. This improvement comprises a pair of bias generating circuits which are crossconnected to the collectors of the differential transistors. This cross-connection makes it very difficult to expand the circuit to a circuit suitable for determining the extreme level of more than two input signals.

SUMMARY OF THE INVENTION

It is, inter alia, an object of the invention to provide an extreme level circuit which also prevents distortions from occurring but which can easily be expanded to a circuit suitable for determining the extreme level of more than two input signals. To this end, one aspect of the invention provides an extreme level circuit for determining an extreme level of a plurality of input levels, the extreme level circuit comprising a plurality of independent parallel branches with intercoupled output terminals from which the extreme level can be taken, each branch having an input terminal for receiving a respective one of the input levels, and including a separate distortion compensation circuit which is independent of the distortion compensation circuits of the other parallel branches.

The extreme level circuit for determining an extreme level of a plurality of input levels in accordance with the present invention includes a plurality of independent parallel branches with intercoupled output terminals from which the extreme level (maximum or minimum) can be taken. Each branch has an input terminal for receiving a respective one of the input levels, and includes a separate distortion compensation circuit which is independent of the distortion compensation circuits of the other parallel branches. It is thus easily possible to add further independent parallel branches in order to be able to calculate the extreme value of as many input values as is desired.

These and other aspects of the invention will be apparent from and elucidated with reference to the embodiments described hereinafter.

DESCRIPTION OF THE PREFERRED EMBODIMENTS

Figure 1:
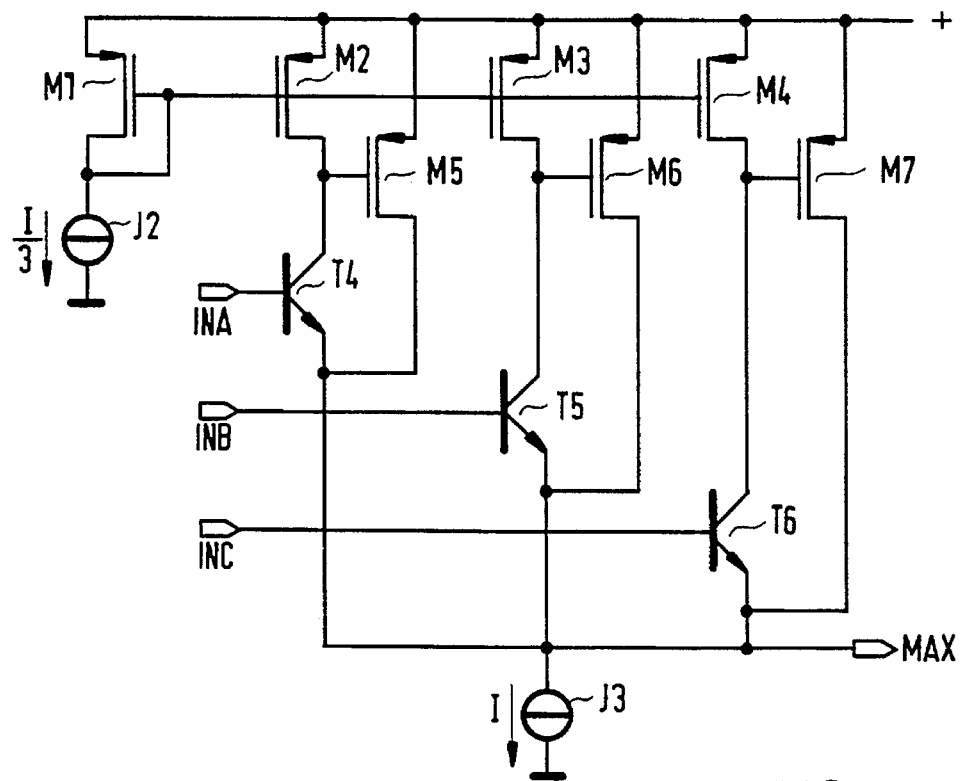
FIG. 1 shows a first embodiment of an extreme level circuit in accordance with the present invention.

In FIG. 1, input signals INA, INB and INC are applied to the base terminals of NPN transistors T4, T5 and T6, respectively. The emitters of the transistors T4, T5 and T6 are interconnected, connected to ground thru a current source J3 which pulls a current I, and connected to an output terminal which delivers the maximum value of the input signals INA, INB and INC. The collectors of the transistors T4, T5 and T6 are connected to a positive supply line thru respective PMOSFETs M2, M3 and M4, which FETs form a current mirror with an input FET M1 whose gate and drain are connected to ground thru a current source J2 which pulls a current I/3. Further, the emitters of the transistors T4, T5 and T6 are connected to the positive supply line thru respective PMOSFETs M5, M6 and M7, whose respective gate terminals are connected to the collectors of the transistors T4, T5 and T6, respectively.

In this circuit, the maximum current thru the transistors T4, T5 and T6 is limited by the current sources M2, M3 and M4. Hence, the current thru the transistors T4, T5 and T6 will not exceed I/3. Suppose that the base of transistor T5 receives the largest of the three input signals INA, INB and INC. In this case, the current thru transistor T5 will be I/3, while the currents thru the transistors T4 and T6 will be lower, determined by their respective base-emitter voltages Vbe(T4)=INA−(INB−Vbe(T5)) and Vbe(T6)=INC−(INB−Vbe(T5)). Consequently, the series-FETs M2 and M4 will go into saturation, so that the gate-source voltages of the corresponding parallel-FETs M5 and M7 will be so low that these parallel-FETs M5 and M7 are switched off. The parallel-FET M6 will convey a current which is given by the current I thru the current source J3 minus the current I/3 thru the transistor T5 and minus the collector currents of the transistors T4 and T6.

As a result of the constant collector current thru the transistor T4, T5, T6 which (from time to time) receives the largest of the three input signals INA, INB, INC, its δVbe will be small, so that no significant amplitude distortion will be shown.

For M2, M3 and M4, MOS (PMOS) transistors were chosen, because if the current thru the NPN transistors is lower than the current source feeding its collector, the current source pulls the collector node to the supply voltage. With PNP transistors instead of MOSFETs, this would lead to big substrate currents when the current source saturates, and the PNPs would only slowly come out of saturation which would make the circuit less suitable for high frequencies. In principle, also FETs could be used for the transistors T4, T5 and T6, but bipolar transistors can more easily be matched. For M5, M6 and M7, MOS transistors are chosen because the gate-source capacitance of a MOS transistor is smaller than the corresponding base-emitter capacitance of corresponding bipolar PNP transistors which are thus less suitable for high frequencies.

Figure 2:
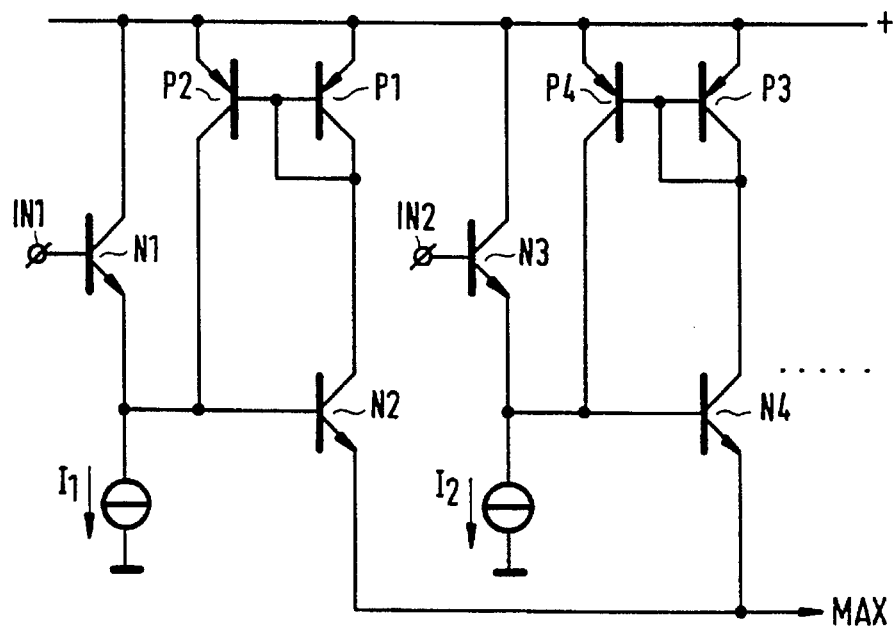
FIG. 2 shows a second embodiment of an extreme level circuit in accordance with the present invention.

In FIG. 2, two parallel branches of another maximum detection circuit are shown; extension to any desired number of parallel branches is easily possible. Input signal levels IN1, IN2 are applied to base terminals of NPN transistors N1 and N3, respectively, whose collectors are connected to a positive supply line and whose emitters are connected to ground thru respective current sources I1, I2, and connected to respective base terminals of NPN transistors N2, N4. Emitters of the transistors N2, N4 are connected to an output supplying the maximum value MAX of the input signals. Collectors of the transistors N2, N4 are connected to their respective base terminals thru respective PNP current mirrors P1, P2 and P3, P4.

This circuit thus comprises in each branch two base-emitter junctions in series (N1, N2 and N3, N4). If the current thru the transistor N2 (N4) increases, the additional current is mirrored by the current mirror P1, P2 (P3, P4) so that the current thru the transistor NI (N3) decreases, as the sum of the current to the emitter of the transistor N1 (N3) and the current to the transistor P2 (P4) is constant due to the constant current source I1 (I2). Consequently, a current increase thru the transistor N2 (N4) is compensated by an identical current decrease thru the transistor N1 (N3), and as a result, a Vbe modification of the transistor N2 (N4) is compensated by an identical Vbe modification of the transistor N1 (N3). Any distortions caused by these Vbe modifications as set out in detail in EP-A-0,430,707 are thus automatically compensated for.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The embodiments of FIGS. 1, 2 show maximum detection circuits; minimum detection circuits can easily be obtained therefrom by interchanging NPN and PNP transistors etcetera. Alternatively, a minimum can be calculated by taking the inverted maximum of inverted input signals, which causes no additional components in a balanced environment in which at several stages both an output and an inverted output and both an input and an inverted input are available. The circuit of FIG. 2 provides the advantage that it can be build in pure bipolar manufacturing processes. The extreme level circuits according to the present invention can very advantageously be used in luminance transient improvement circuits.

We claim:

1. An extreme level circuit for determining an extreme level of a plurality of input levels, the extreme level circuit comprising a plurality of independent parallel branches having intercoupled output terminals from which the extreme level can be taken, each of said independent parallel branches having an input terminal for receiving a respective one of the input levels, and a separate distortion compensation circuit which is independent of the distortion compensation circuits of the other independent parallel branches, wherein each of said independent parallel branches comprises a first bipolar transistor and a second bipolar transistor, said first and second bipolar transistors each having a base and an emitter, wherein a path between the base and emitter of said first bipolar transistor is connected in series with a path between the base and emitter of said second bipolar transistor between the input and output terminals of said independent parallel branch; a current mirror having an input connected to a collector of the second bipolar transistor and an output connected to a connection point of the base-emitter paths of the first and second bipolar transistors; and a constant current source connected to the emitter of the first bipolar transistor for furnishing a constant sum current to the first bipolar transistor and the output of the current mirror, the input terminal being connected to the base of the first bipolar transistor and the output terminal being connected to the emitter of the second bipolar transistor, wherein said current mirror and said constant current source form the distortion compensation circuit.

2. An extreme level circuit for determining an extreme level of a plurality of input levels, the extreme level circuit comprising a plurality of independent parallel branches having intercoupled output terminals from which the extreme level can be taken, each of said independent parallel branches having an input terminal for receiving a respective one of the input levels, and a separate distortion compensation circuit which is independent of the distortion compensation circuits of the other parallel branches, wherein each of said independent parallel branches further comprises:

a first transistor having a control terminal coupled to the input terminal, a first main terminal coupled to the output terminal, and a second main terminal;

a second transistor having a control terminal coupled to the second main terminal of the first transistor, a first main terminal coupled to a supply terminal, and a second main terminal coupled to the first main terminal of the first transistor; and current source means coupled to the second main terminal of the first transistor.

3. An extreme level circuit as claimed in claim 2, wherein said current source means comprises:

a first current source transistor having a control terminal, a first main terminal coupled to the supply terminal, and a second main terminal coupled to the second terminal of the first transistor; and a second current source transistor having a control terminal coupled to the control terminal of the first current source transistor, a first main terminal coupled to the supply terminal, and a second main terminal coupled to its control terminal and to a constant current source, said distortion compensation circuit being formed by said first current source transistor and said second transistor.

4. An extreme level circuit as claimed in claim 3, wherein said first and second current source transistors are MOSFETs.

5. An extreme level circuit as claimed in claim 2, wherein said first transistor is a bipolar transistor.

6. An extreme level circuit as claimed in claim 2, wherein said second transistor is a MOSFET.

* * * * *